United States Patent
Osakabe et al.

[11] Patent Number: 6,102,109
[45] Date of Patent: Aug. 15, 2000

[54] COOLING DEVICE BOILING AND CONDENSING REFRIGERANT

[75] Inventors: Hiroyuki Osakabe, Chita-gun; Takahide Ohara, Okazaki, both of Japan

[73] Assignee: Denso Corporation, Kariya, Japan

[21] Appl. No.: 09/209,391

[22] Filed: Dec. 10, 1998

[30] Foreign Application Priority Data

Jan. 19, 1998 [JP] Japan ................................. 10-007983

[51] Int. Cl.⁷ .......................... F28D 15/00; H01L 23/34; H05K 7/20
[52] U.S. Cl. ................................ 165/104.33; 165/104.21; 257/715; 361/700
[58] Field of Search ........................ 165/104.14, 104.21, 165/104.33; 257/715; 361/699, 700

[56] References Cited

U.S. PATENT DOCUMENTS

| | | | |
|---|---|---|---|
| 4,705,102 | 11/1987 | Kanda et al. | 165/104.33 |
| 5,713,413 | 2/1998 | Osakabe et al. | 165/104.33 |
| 5,832,989 | 11/1998 | Osakabe et al. | 165/104.33 |

FOREIGN PATENT DOCUMENTS

| | | | |
|---|---|---|---|
| 357204156 | 12/1982 | Japan | 257/715 |
| 10-98142 | 4/1998 | Japan. | |
| 1427435 | 9/1988 | U.S.S.R. | 257/715 |

*Primary Examiner*—Carl D. Price
*Assistant Examiner*—Tho Duong
*Attorney, Agent, or Firm*—Harness, Dickey & Pierce, PLC

[57] ABSTRACT

A cooling device includes a refrigerant tank in which liquid refrigerant is boiled, and a radiator in which gas refrigerant is condensed. A connection pipe is formed in the radiator so that refrigerant communicates between the refrigerant tank and the radiator. An interior of the connection pipe is partitioned into a first communication passage and a second communication passage, and a restriction plate is provided between the first communication passage and a refrigerant-condensing passage of the radiator to prevent liquid refrigerant from flowing into the refrigerant-condensing passage. Thus, when heat-generating amount of a heat-generating member becomes larger so that liquid refrigerant is vehemently boiled in the refrigerant tank and a part of liquid refrigerant is blown upwardly together with refrigerant vapor, the restriction plate prevents the liquid refrigerant from flowing into the refrigerant-condensing passage of the radiator while gas refrigerant readily passes through the restriction plate.

8 Claims, 12 Drawing Sheets

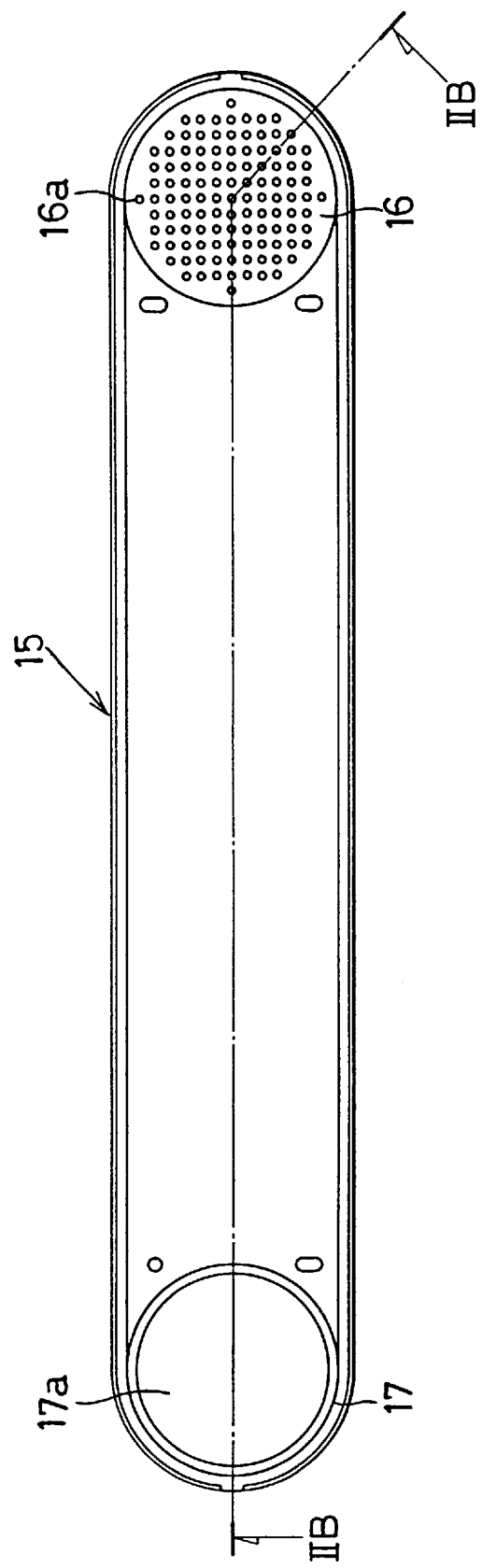
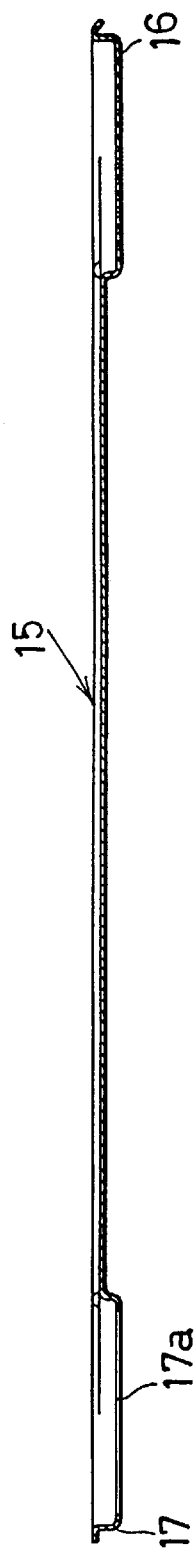
FIG. 2A
FIG. 2B

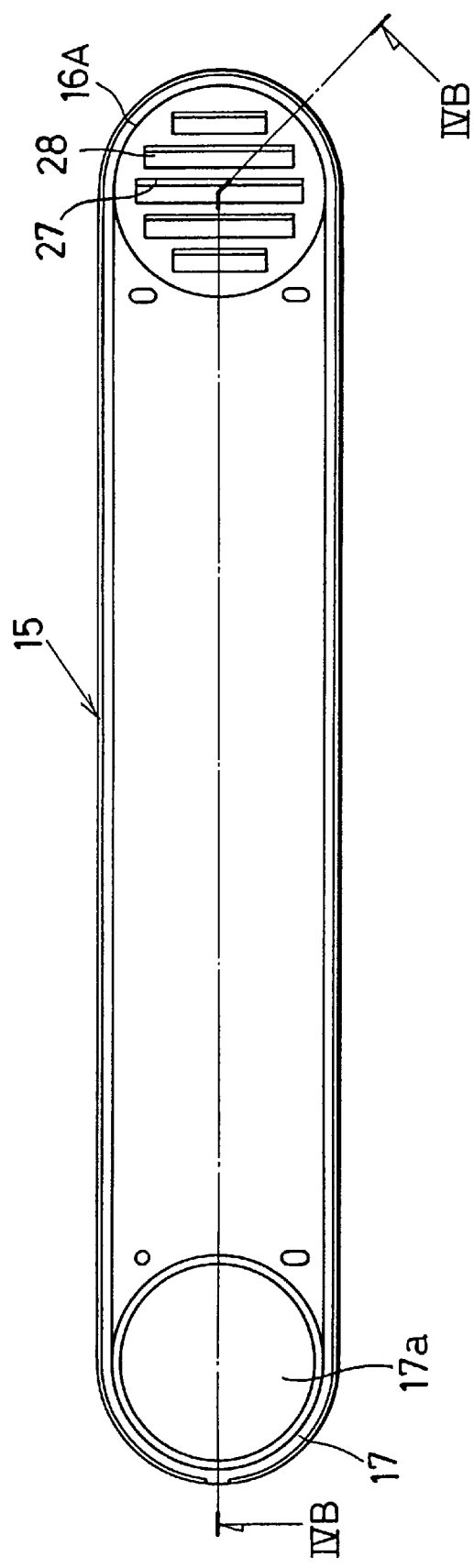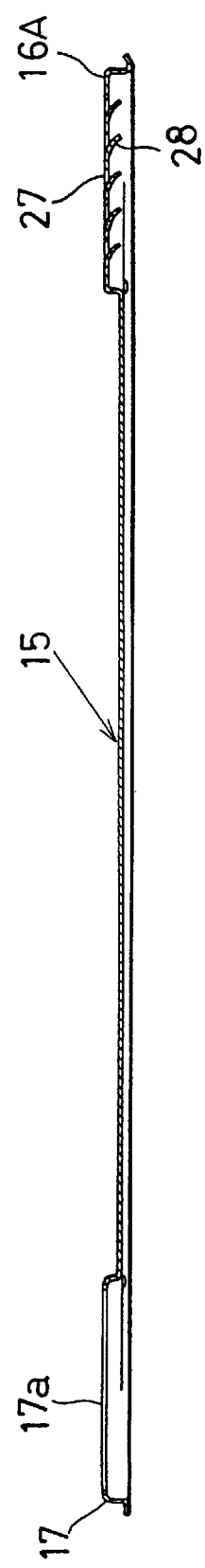
FIG. 4A
FIG. 4B

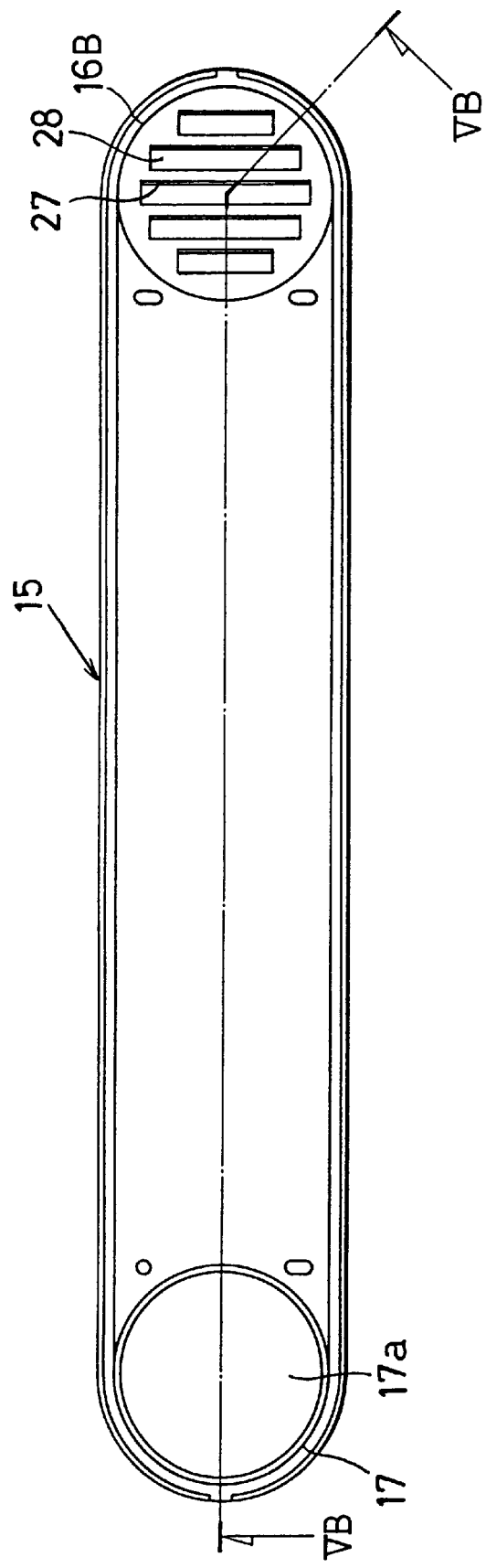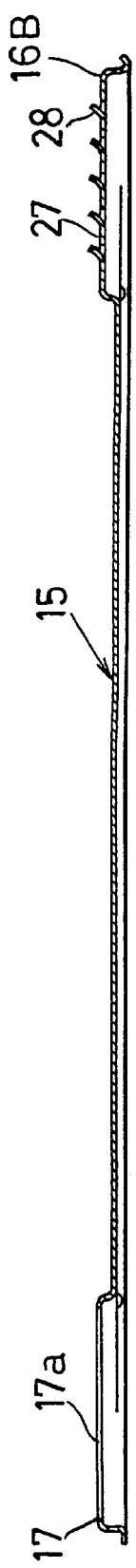
FIG. 5A
FIG. 5B

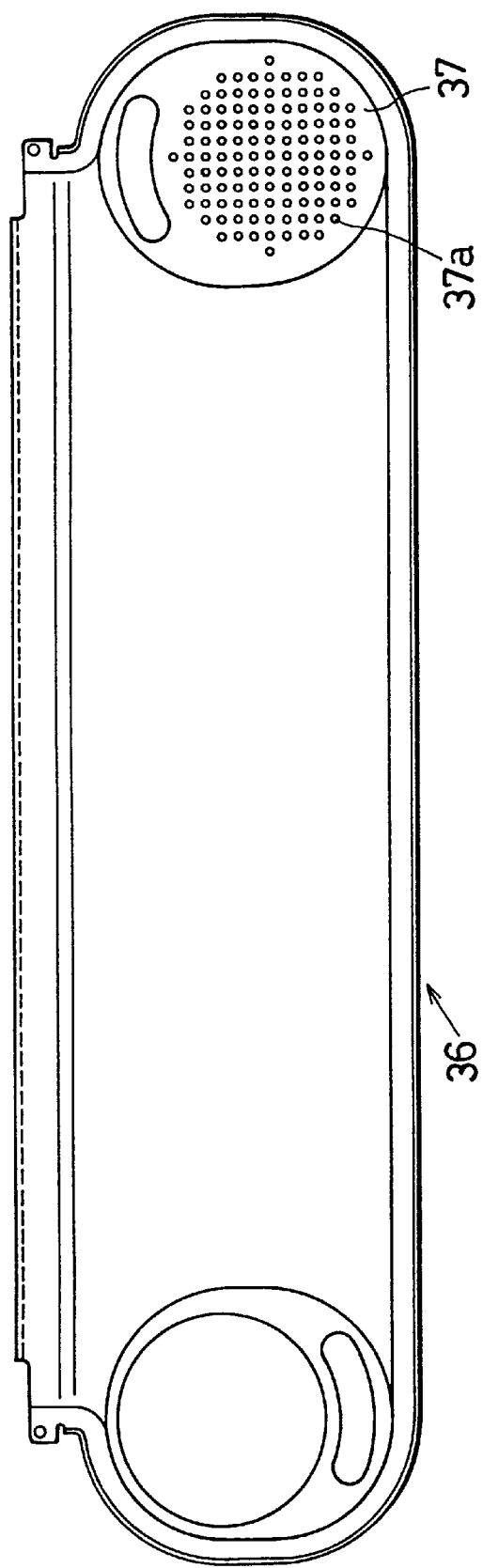
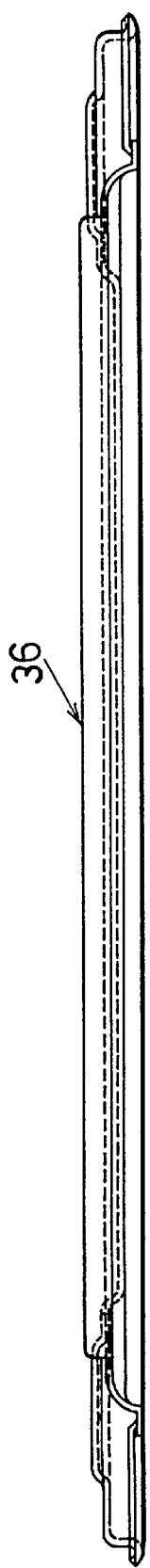

COOLING DEVICE BOILING AND CONDENSING REFRIGERANT

CROSS-REFERENCE TO RELATED APPLICATION

This application is related to and claims priority from Japanese Patent Application No. Hei. 10-7983 filed on Jan. 19, 1998, the contents of which are hereby incorporated by reference.

BACKGROUND OF THE INVENTION

1. Field of the Invention

The present invention relates to a cooling device boiling and condensing refrigerant, which absorbs heat generated from a heat-generating member to cool the heat-generating member.

2. Description of Related Art

In a conventional cooling device, heat generated from a heat-generating member is radiated to an outside fluid by repeating boiling and condensing operations of refrigerant. However, when the amount of heat generated from the heat-generating member increases, gas refrigerant (i.e., refrigerant vapor) evaporated in a refrigerant tank is blown up, and a part of liquid refrigerant is also introduced into a radiator together with the gas refrigerant. In this case, when the liquid refrigerant is introduced into a refrigerant-condensing passage of the radiator, heat-radiating performance of refrigerant in the radiator is greatly decreased.

SUMMARY OF THE INVENTION

In view of the foregoing problems, it is an object of the present invention to provide a cooling device having a refrigerant tank and a radiator, which prevents liquid refrigerant rising from the refrigerant tank from flowing into a refrigerant-condensing passage of the radiator so that heat-radiating performance of refrigerant in the radiator can be improved.

According to the present invention, a cooling device includes a restriction member which is disposed between a refrigerant chamber of a refrigerant tank and a refrigerant-condensing passage of a radiator to prevent liquid refrigerant rising together with gas refrigerant from the refrigerant chamber from flowing into the refrigerant-condensing passage. Further, the restriction member has a plurality of openings for passing through gas refrigerant, each of the openings has a predetermined opening area smaller than a passage sectional area of an inlet passage of the radiator. Thus, liquid refrigerant does not flow into the refrigerant-condensing passage of the radiator, while gas refrigerant passes through the openings of the restriction member and flows into the refrigerant-condensing passage of the radiator. As a result, heat-radiating performance of refrigerant in the radiator can be improved.

Preferably, the radiator includes a plurality of tubes each of which is formed by connecting two tube plates into a hollow shape, and the restriction member is one of the tube plates. Therefore, the restriction member can be readily formed.

More preferably, the restriction member is formed by a plurality of restriction plates each having a plurality of openings, and the restriction plates are disposed to have a predetermined distance therebetween in a flow direction of gas refrigerant. Therefore, it can sufficiently prevent liquid refrigerant from flowing into the refrigerant-condensing passage while only gas refrigerant is introduced into the refrigerant-condensing passage.

BRIEF DESCRIPTION OF THE DRAWINGS

Additional objects and advantages of the present invention will be more readily apparent from the following detailed description of preferred embodiments when taken together with the accompanying drawings, in which:

FIG. 2A is a plan view of an upper plate of a connection pipe according to the first embodiment, and FIG. 2B is a cross-sectional view taken along line IIB—IIB of FIG. 2A;

FIG. 4A is a plan view of an upper plate of a connection pipe according to a second preferred embodiment of the present invention, and FIG. 4B is a cross-sectional view taken along line IVB—IVB of FIG. 4A;

FIG. 5A is a plan view of an upper plate of a connection pipe according to the second embodiment, and FIG. 5B is a cross-sectional view taken along line VB—VB of FIG. 5A;

FIGS. 14A and 14B are a plan view and a side view, respectively, of a tube plate forming a heat radiating tube according to the sixth embodiment.

DETAILED DESCRIPTION OF THE PRESENTLY PREFERRED EMBODIMENTS

Preferred embodiments of the present invention are described hereinafter with reference to the accompanying drawings.

Figure 1A:
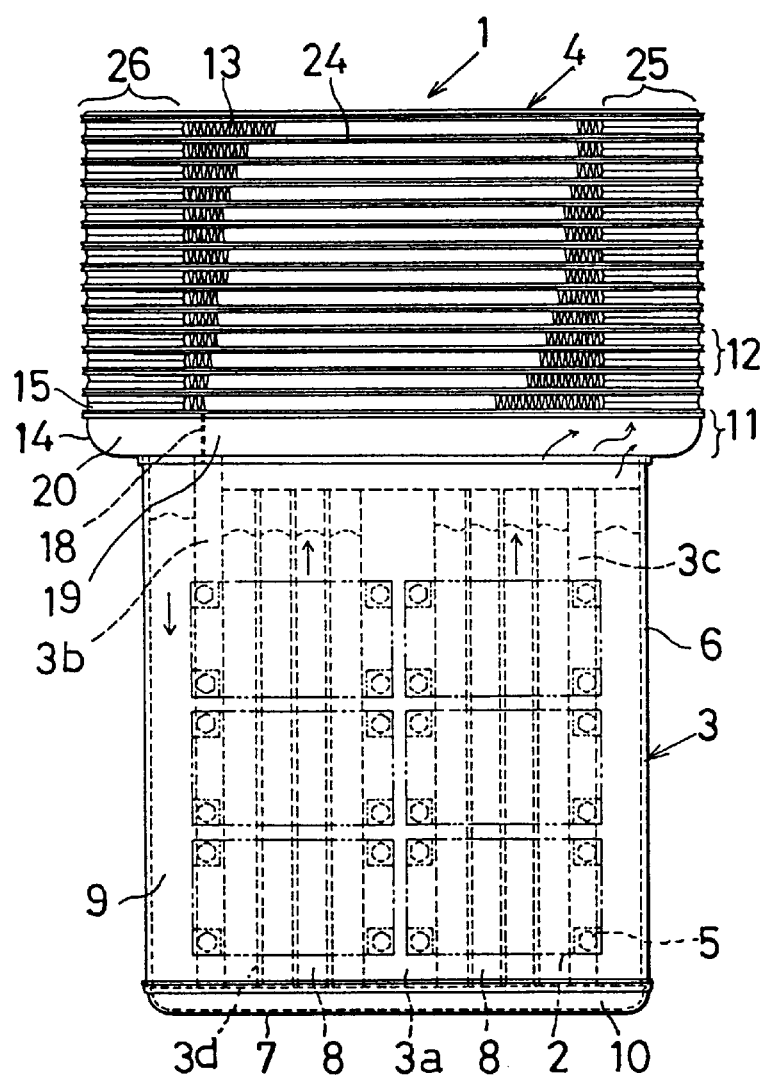
FIGS. 1A and 1B are a front view and a side view, respectively, of a cooling device according to a first preferred embodiment of the present invention.
Figure 1B:
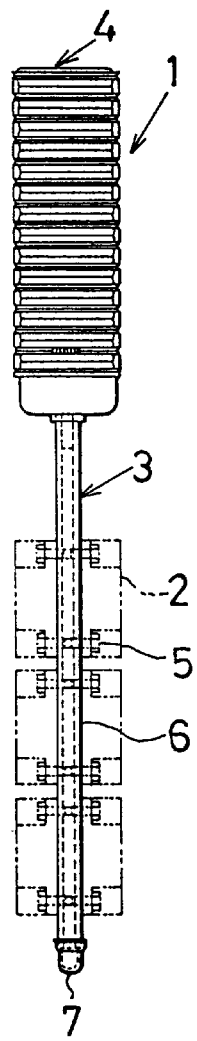

A first preferred embodiment of the present invention will be now described with reference to FIGS. 1–3. As shown in FIGS. 1A, 1B, a cooling device 1 for cooling a heat-generating member 2 includes a refrigerant tank 3 in which liquid refrigerant is stored, and a radiator 4 disposed at an upper side of the refrigerant tank 3. The heat-generating member 2 is IGBT modules forming an inverter circuit of an electrical vehicle or a general electrical controller, for example. The heat-generating member 2 is fixed to a surface of the refrigerant tank 3 using screws 5.

The refrigerant tank 3 includes a hollow extrusion member 6 formed by extruding an aluminum block, and a cap 7 covered and attached to a lower end of the extrusion member 6. A refrigerant chamber 8 is provided in the refrigerant tank 3 between a first supporting portion 3a at an approximate center and both second and third supporting portions 3b, 3c at both sides of the first supporting portion 3a, and is partitioned into a plurality of passages by a plurality of partition walls 3d extending vertically. A liquid-refrigerant returning passage 9 is for introducing liquid refrigerant condensed and liquefied in the radiator 4 into the refrigerant tank 3, and is provided in the refrigerant tank 3 at an outer side of the second supporting portion 3b. Screw holes into which the screws 5 for fixing the heat-generating member 2 are screwed are formed in each of the first supporting portion 3a, the second supporting portion 3b and the third supporting portion 3c. The cap 7 is made of the same material as the extrusion member 6, such as aluminum, and is connected to the lower end of the extrusion member 6 by brazing so that a lower end surface of the extrusion member 6 is closed and sealed. However, in the first embodiment, a communication passage 10 through which the reference chamber 8 and the liquid-refrigerant returning passage 9 communicate with each other is formed between the cap 7 and the lower end surface of the extrusion member 6.

Figure 3A:
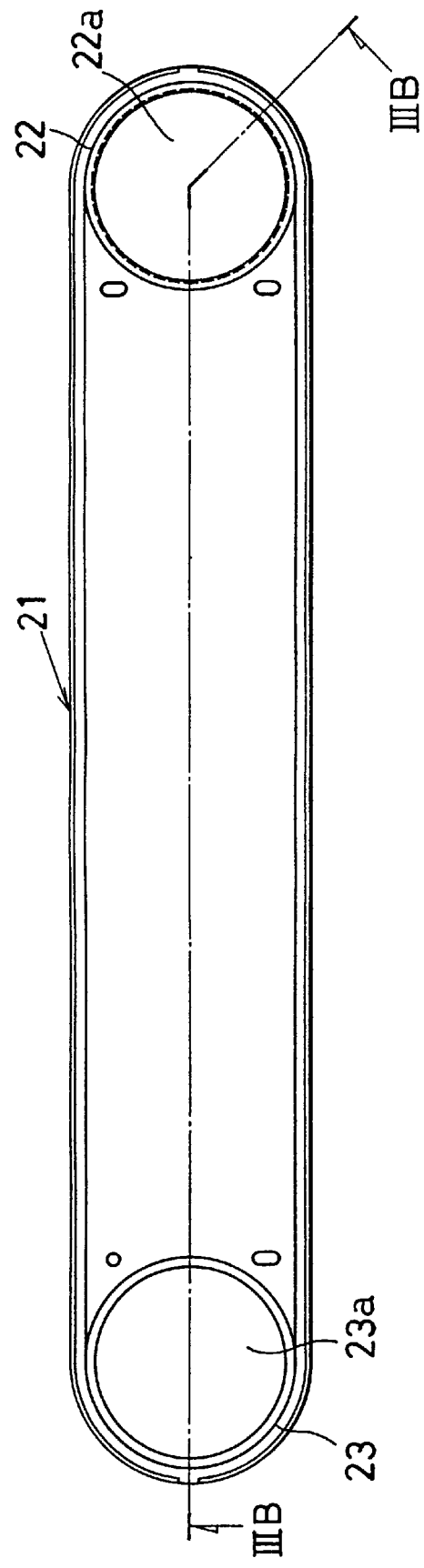
FIG. 3A is a plan view of a tube plate forming a heat radiating tube according to the first embodiment.
Figure 3B:
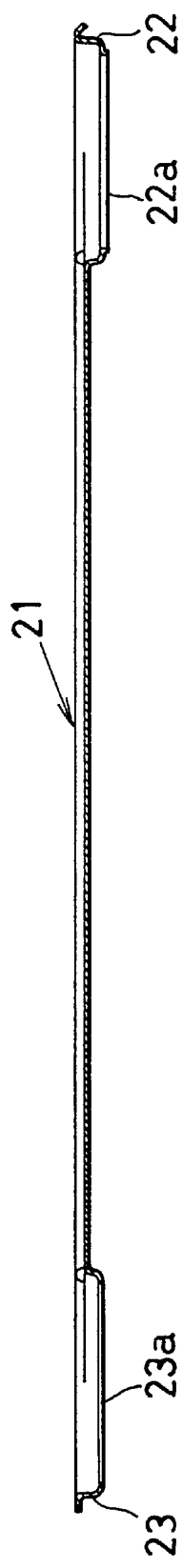
FIG. 3B is a cross-sectional view taken along line IIIB—IIIB of FIG. 3A.

The radiator 4 is a drawn-cup type heat exchanger. As shown in FIG. 1A, the radiator 4 includes a connection pipe 11, a plurality of heat-radiating tubes 12 and a plurality of heat radiating fins 13 so that air horizontally passes through the radiator 4. The connection pipe 11 connects the refrigerant tank 3 and the heat radiating tube 12, and is formed hollowly by connecting peripheral portions of a lower tank 14 and an upper plate 15 made of aluminum. The lower tank 14 is formed into a dish like, a longer hole is opened in a bottom center portion, and an upper end of the refrigerant tank 3 is inserted into the longer hole of the lower tank 14 of the connection pipe 11. As shown in FIGS. 2A and 2B, the upper plate 15 of the connection pipe 11 is formed into a thin-longer shape, and circular first and second connection portions 16, 17 are formed at both ends of the upper plate 15 in a longitudinal direction of the upper plate 15. Further, a plurality of small holes 16a are opened in the first connection portion 16, and a circular communication hole 17a is opened in the second connection portion 17. In the first embodiment, hereinafter, the first connection portion 16 in which the small holes 16a are opened is referred to as "restriction plate 16". An interior of the connection pipe 11 is partitioned by a partition plate 18 into a first communication passage 19 communicating with the refrigerant chamber 8, and a second communication passage 20 communicating with the liquid-refrigerant returning passage 9 of the refrigerant tank 3. Each of the heat radiating tubes 12 is formed into a hollow flat tube by joining two symmetrical tube plates 21 on outer peripheral portions. As shown in FIGS. 3A, 3B, each of the both tube plates 21 is formed into a shape approximately similar to the upper plate 15 of the connection pipe 11. Circular connection portions 22, 23 are formed at both ends of each tube plate 21 in the longitudinal direction. Further, a circular communication hole 22a is opened in the connection portion 22 at one end side, and a circular communication hole 23a is opened in the connection portion 23 at the other end side. The communication holes 22a, 23a are not opened in the connection portions 22, 23 of an upper tube plate 21 forming the upset heat radiating tube 12. Alternatively, the communication holes 22a, 23a may be opened in the connection portions 22, 23 of the upper tube plate 21 forming the upset heat radiating tube 12, if they are closed by a cover. In each of the flat heat radiating tubes 12, a refrigerant-condensing passage 24 is formed between the connection portions 22, 23. The heat radiating tubes 12 are laminated in an up-down direction so that the connection portion 22 in each tube plate 21 are connected to each other and the connection portions 23 in each tube plate 21 are connected to each other. Therefore, in the laminated heat radiating tubes 12, communications holes 22a, 23a opened in the connection portions 22, 23 communicate with each other. Here, a passage formed by the communication holes 22a of the connection portion 22 is referred to as an inlet passage 25, and a passage formed by the communication holes 23a of the connection portion 23 is referred to as an outlet passage 26.

The inlet passage 25 communicates with the first communication passage 19 of the connection pipe 11 through the small holes 16a opened in the restriction plate 16 of the upper plate 15. The outlet passage 26 communicates with the second communication passage 20 of the connection pipe 11 through the communication holes 17a opened in the second connection portion 17 of the upper plate 15.

The heat radiating fins 13 are corrugated fins each of which is made thin plate formed into a wave shape by bending the plate in alternate directions. Each of the heat radiating fins 13 is brazed on the plates 15, 21 to be connected between the connection pipe 11 and the heat radiating tube 12 and between adjacent the heat radiating tubes 12.

Next, operation of the cooling device according to the first embodiment will be now described.

When heat generated from the heat-generating member 2 is transmitted to liquid refrigerant staying in the refrigerant chamber 8 through wall surfaces of the refrigerant tank 3, a part of liquid refrigerant in the refrigerant tank 3 is boiled and evaporated. The boiled refrigerant vapor (i.e., gas refrigerant) rises in the refrigerant chamber 8, and flows into the inlet passage 25 of the radiator 4 through the first communication passage 19 of the connection pipe 11. In this case, when the amount of heat generated from the heat-generating member 2 becomes larger, a large amount of liquid refrigerant is boiled, and the boiling operation of liquid refrigerant is violently performed. Therefore, a large amount refrigerant vapor is blown upwardly, and a part of liquid refrigerant may be introduced into the radiator 4 together with the refrigerant vapor. The liquid refrigerant rising to the first communication passage 19 of the connection pipe 11 is closed by the restriction plate 16 of the upper plate 15 so that it can prevent liquid refrigerant from being introduced into the inlet passage 25 of the radiator 4. On the other hand, gas refrigerant rising into the first communication passage 19 of the connection pipe 11 readily flows into the inlet passage 25 through the multi-small holes 16a.

Gas refrigerant flowing into the inlet passage 25 of the radiator 4 is distributed into refrigerant-condensing passage 24, and is heat-exchanged with outside air while passing through the refrigerant-condensing passage 24. Therefore, gas refrigerant is condensed on the wall surface of the refrigerant-condensing passage 24. The condensed liquid refrigerant flows from the refrigerant-condensing passage 24 to the outlet passage 26, and is dropped to the liquid-refrigerant returning passage 9 of the refrigerant tank 3 through the second communication passage 20 of the connection pipe 11. The liquid refrigerant in the liquid-refrigerant returning passage 9 is supplied again to the refrigerant chamber 8 through the communication passage 10 within the cap 7. Refrigerant latent-heat generated when gas refrigerant is condensed is transmitted to the heat radiating fins 13, and is transmitted to outside air passing through the radiator 4. As described above, by repeating the above-described boiling and condensing operations of refrigerant, heat generated from the heat-generating member 2 is transmitted to outside air, and the temperature of the heat-generating member 2 can be suppressed.

According to the first embodiment of the present invention, because the restriction plate 16 is disposed between the first communication passage 19 of the connection pipe 11 and the inlet passage 25, most liquid refrigerant rising together with refrigerant vapor contacts the restriction plate 16 of the upper plate 15, and is returned to the refrigerant chamber 8. Therefore, it can prevent liquid refrigerant rising together with refrigerant vapor from being introduced into the inlet passage 25 of the radiator 4. As a result, the liquid refrigerant does not flow into the refrigerant-condensing passage 24 of the radiator 4 so that the heat-radiating performance of refrigerant in the refrigerant-condensing passage 24 can be improved. More particularly, because the radiator 4 is formed so that outside air flows horizontally, the height of the refrigerant-condensing passage 24 becomes lower. In this case, if liquid refrigerant is introduced into the refrigerant-condensing passage 24, liquid refrigerant readily stays in the refrigerant-condensing passage 24, and the heat-radiating performance is decreased. Thus, in this case, the merit of the first embodiment of the present invention can be sufficiently displaced.

A second preferred embodiment of the present invention will be now described with reference to FIGS. 4A, 4B, 5A, 5B. In the above-described first embodiment, a plurality of small holes 16a are provided in the restriction plate 16 (i.e., first connection portion 16) of the upper plate 15. In the second embodiment, as shown in FIG. 4A, a plurality of slit-like opening portions 27 are formed in a first connection portion 16A, and a louver 28 is provided in each of the opening portions 27. As shown in FIG. 4B, each louver 28 is cut to protrude toward an inner side of the upper plate 15 (i.e., the side of the first communication passage 19). In the second embodiment, because liquid refrigerant rising from the refrigerant chamber 8 into the inlet passage 25 is closed and stopped by the louvers 28, it can prevent liquid refrigerant from being introduced into the refrigerant-condensing passage 24 so that the heat-radiating performance can be improved. Further, in the second embodiment, because the opening area of the opening portions 27 can be made larger, pressure loss in the refrigerant passage can be decreased, as compared with the small holes 16a in the first embodiment.

In FIGS. 4A, 4B, the louvers 28 protrude from the first connection portion 16A toward the inner side of the upper plate 15 (i.e., the side of the first communication passage 19). However, as shown in FIGS. 5A, 5B, the louvers 28 may protrude from a first connection portion 16B toward the outside of the upper plate 15 (i.e., the side of the inlet passage 25). The other portions of the second embodiment are similar to those in the first embodiment, and the explanation thereof is omitted. Thus, in the second embodiment, the effect similar to the first embodiment can be proposed.

Figure 6A:
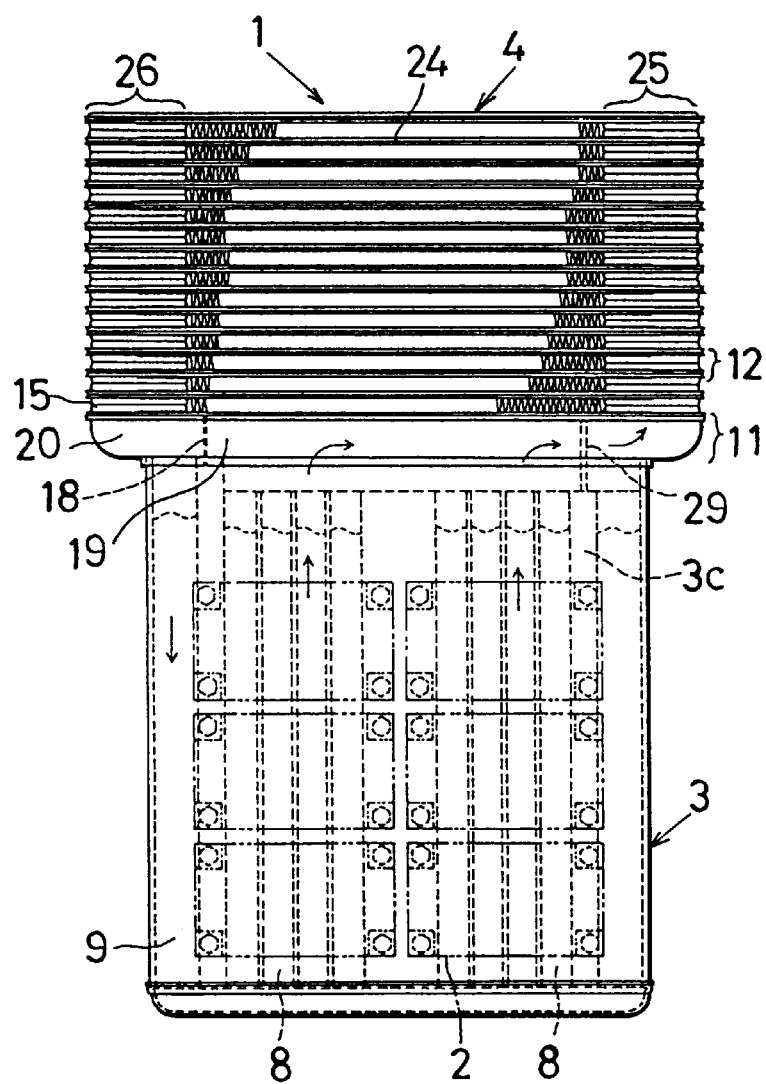
FIGS. 6A and 6B are a front view and a side view, respectively, of a cooling device according to a third preferred embodiment of the present invention.
Figure 6B:
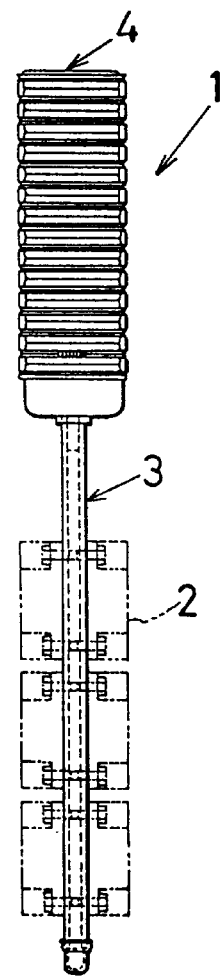
Figure 7:
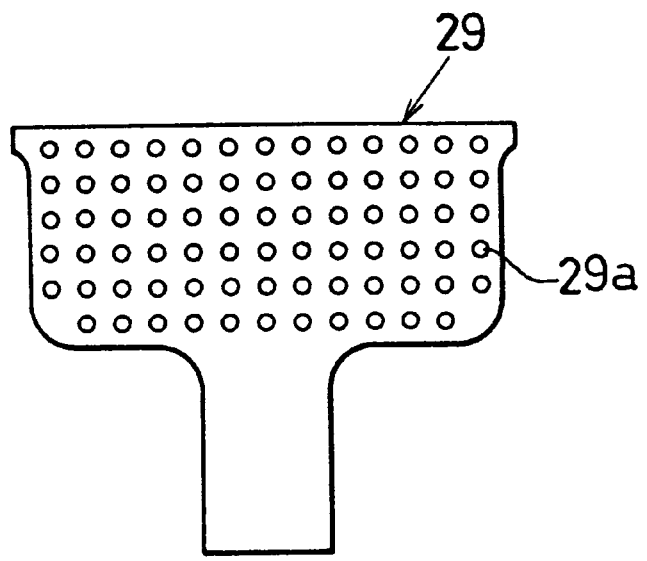
FIG. 7 is a plan view of a restriction plate according to the third embodiment.

A third preferred embodiment of the present invention will be described with reference to FIGS. 6A, 6B, 7. In the third embodiment, a restriction plate 29 for preventing liquid refrigerant from flowing into the inlet passage 25 is disposed in the first communication passage 19 of the connection pipe 11. The restriction plate 29 is disposed in the first communication passage 11 at a direct upper portion of the third supporting portion 3c of the refrigerant tank 3 so that the first communication passage 19 is partitioned into a first part at a side of the refrigerant chamber 8 and a second part at a side of the inlet passage 25. As shown in FIG. 7, the restriction plate 29 has a plurality of small holes 29a. In this case, a circular communication hole is opened in the first connection portion 16 of the upper plate 15 of the connection pipe 11 similarly to that of the second connection portion 17.

According to the third embodiment, refrigerant blown upwardly from the refrigerant tank 8 is closed and stopped by the restriction plate 29 so that it can prevent liquid refrigerant from being introduced into the refrigerant-condensing passage 24. Further, because the connection pipe 11 has a large inner space, a total opening area of the small holes 29a opened in the restriction plate 29 can be made larger as compared with the small holes 16a in the first embodiment. As a result, the restriction plate 29 prevents liquid refrigerant from flowing into the refrigerant-condensing passage 24 without decreasing the minimum opening area of each small holes 29a, that is without increasing pressure loss of the refrigerant passage.

Figure 9:
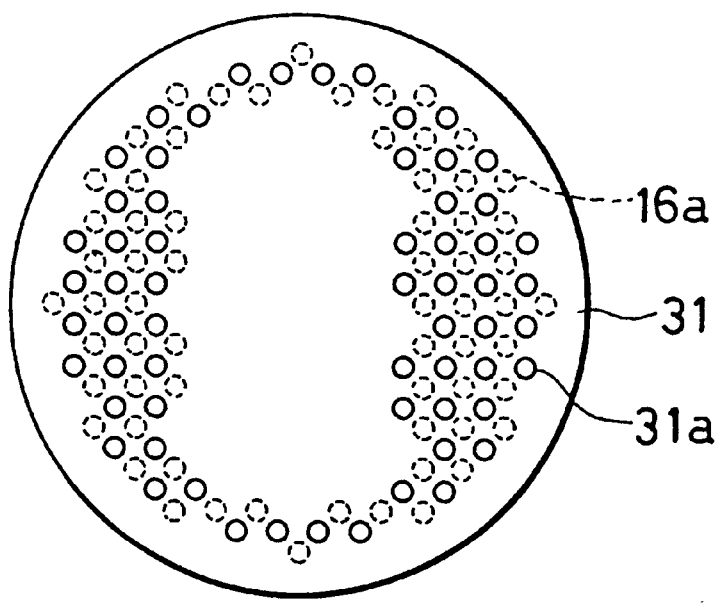
FIG. 9 is plan view showing an overlapped state of both restriction plates according to the fourth embodiment.
Figure 8:
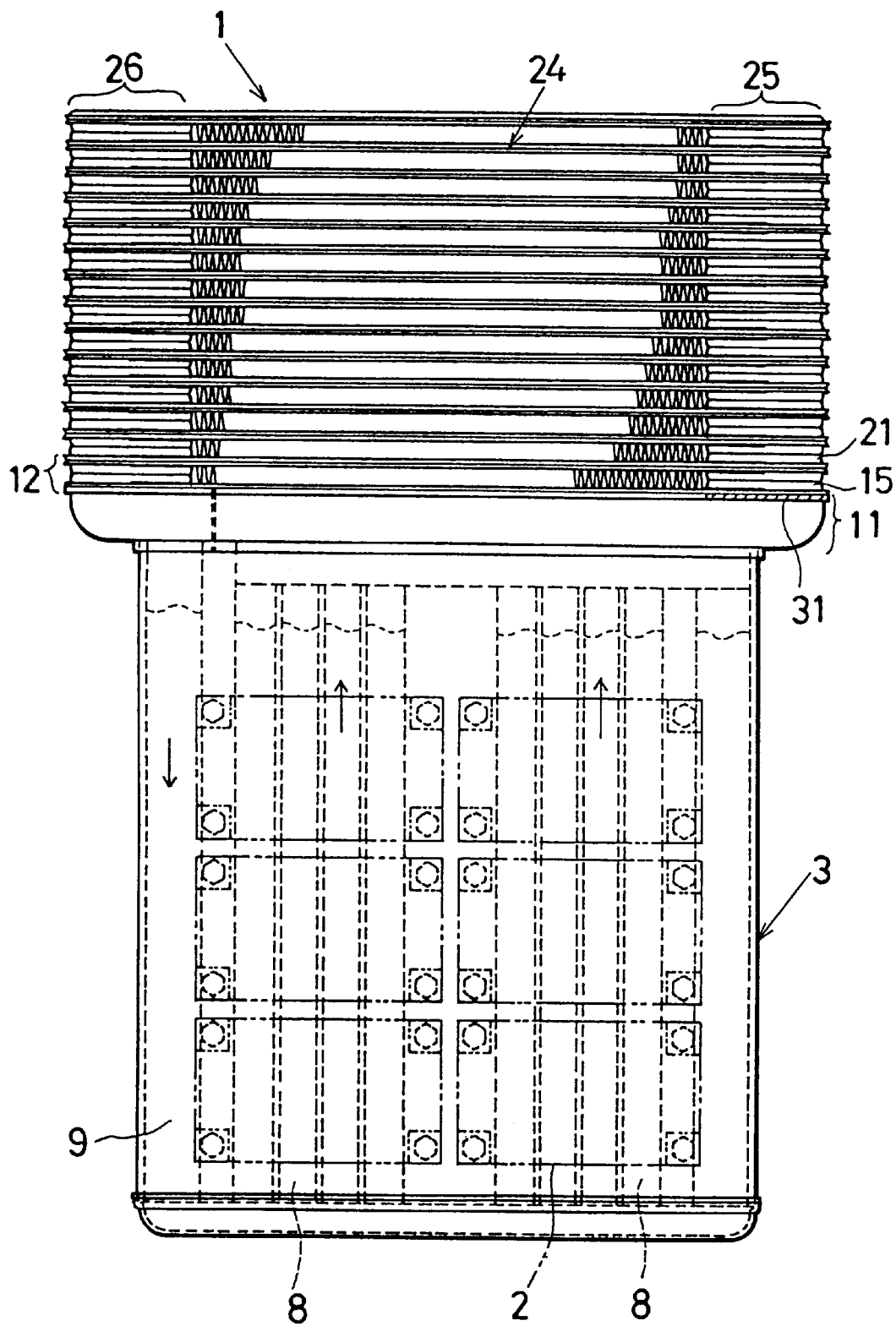
FIG. 8 is a front view of a cooling device according to a fourth preferred embodiment of the present invention.

A fourth preferred embodiment of the present invention will be described with reference to FIGS. 8, 9. In the fourth embodiment, a plurality of restriction plates for restricting liquid refrigerant from flowing into the refrigerant-condensing passage 24 are provided. That is, in the fourth embodiment, a first restriction plate similar to the restriction plate 16 of the first embodiment is formed in the upper plate 15 of the connection pipe 11, and a second restriction plate 31 is disposed in the connection pipe 11 to have a predetermined distance between the first and second restriction plates 16, 31. As shown in FIG. 9, a plurality of small holes 31a are opened in the second restriction plate 31. In both the first and second restriction plates 16, 31, the positions of the small holes 16a and the small holes 31a are shifted from each other as shown in FIG. 9. Thus, even when liquid refrigerant from the refrigerant chamber 8 passes through the small holes 31a of the second restriction plate 31, the liquid refrigerant is closed and stopped by the first restriction plate 16. As the second restriction plate 31, the connection portion 22 of the tube plate 21 forming the heat radiating tube 12 may be used. In this case, a plurality of small holes may be formed instead of the communication hole 22a of the connection portion 22 at one side. For example, the small holes may be provided in the connection portions 22 of an upper side tube plate 21 for forming the lowest heat radiating tube 12 which is a direct upper side of the connection pipe 11. In the fourth embodiment, it is necessary to provide a space between the first and second restriction plates 16, 31 so that gas refrigerant (i.e., refrigerant vapor) passes through the first restriction plate 16, the second restriction plate 31, and therebetween.

In the fourth embodiment, the restriction plate 29 of the third embodiment may be also disposed in the first communication passage 19 of the connection pipe 11. In this case, liquid refrigerant flowing into the inlet passage 25 can be further accurately prevented.

Figure 10A:
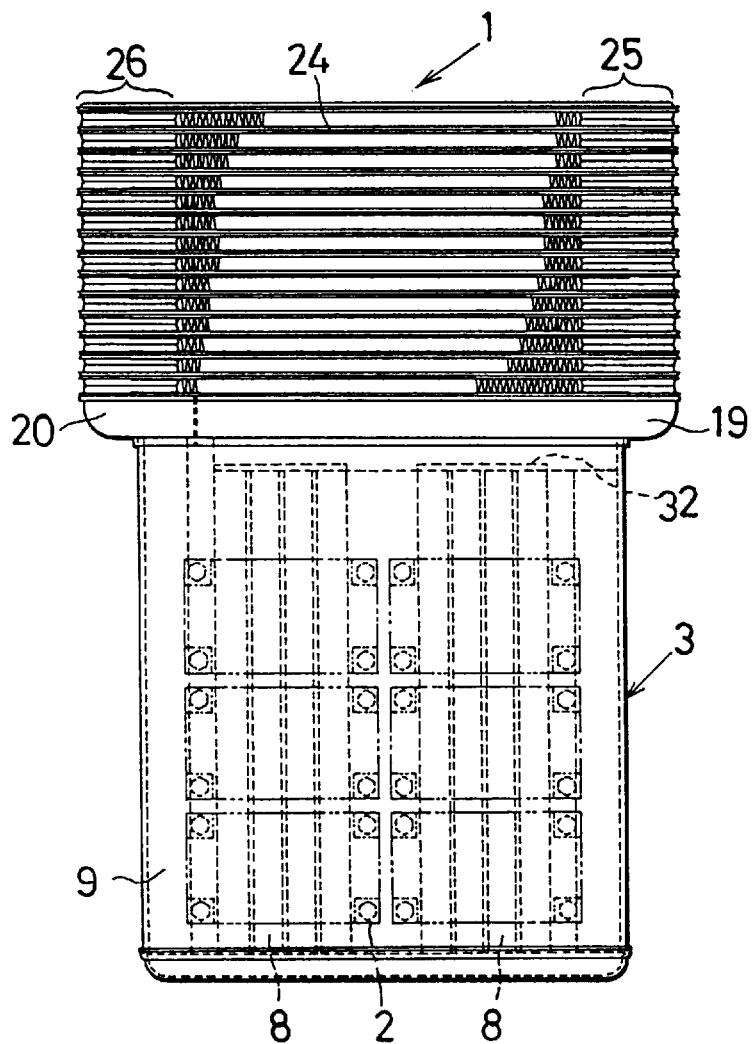
FIGS. 10A and 10B are a front view and a side view, respectively, of a cooling device according to a fifth preferred embodiment of the present invention.
Figure 10B:
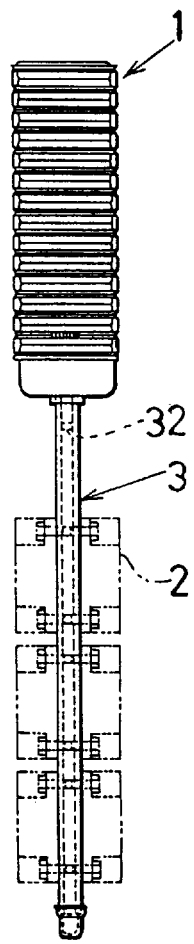
Figure 11:
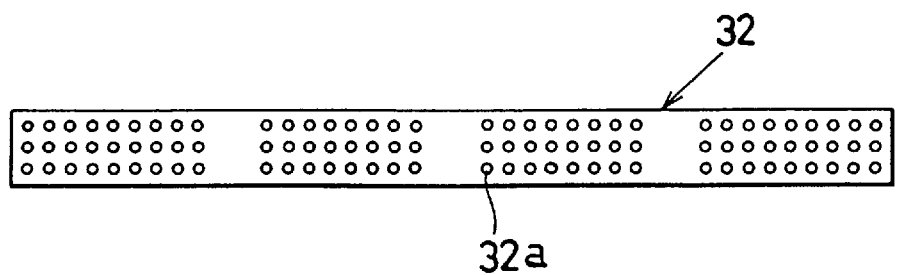
FIG. 11 is a plan view of a restriction plate according to the fifth embodiment.

A fifth preferred embodiment of the present invention will be now described with reference to FIGS. 10A, 10B, 11. In the fifth embodiment, a restriction plate 32 is disposed at a top end surface of the refrigerant chamber 8. As shown in FIG. 11, a plurality of small holes 32a are provided respectively to correspond to each refrigerant passage in the refrigerant chamber 8. Therefore, in the fifth embodiment, refrigerant blown upwardly is restricted by the restriction plate 32, and it can prevent liquid refrigerant from flowing into the refrigerant-condensing passage 24. Similarly to the fourth embodiment, the restriction plate 32 may be used together with the other restriction plates.

A sixth preferred embodiment of the present invention will be described with reference to FIGS. 12, 13, 14A, 14B.

Figure 12:
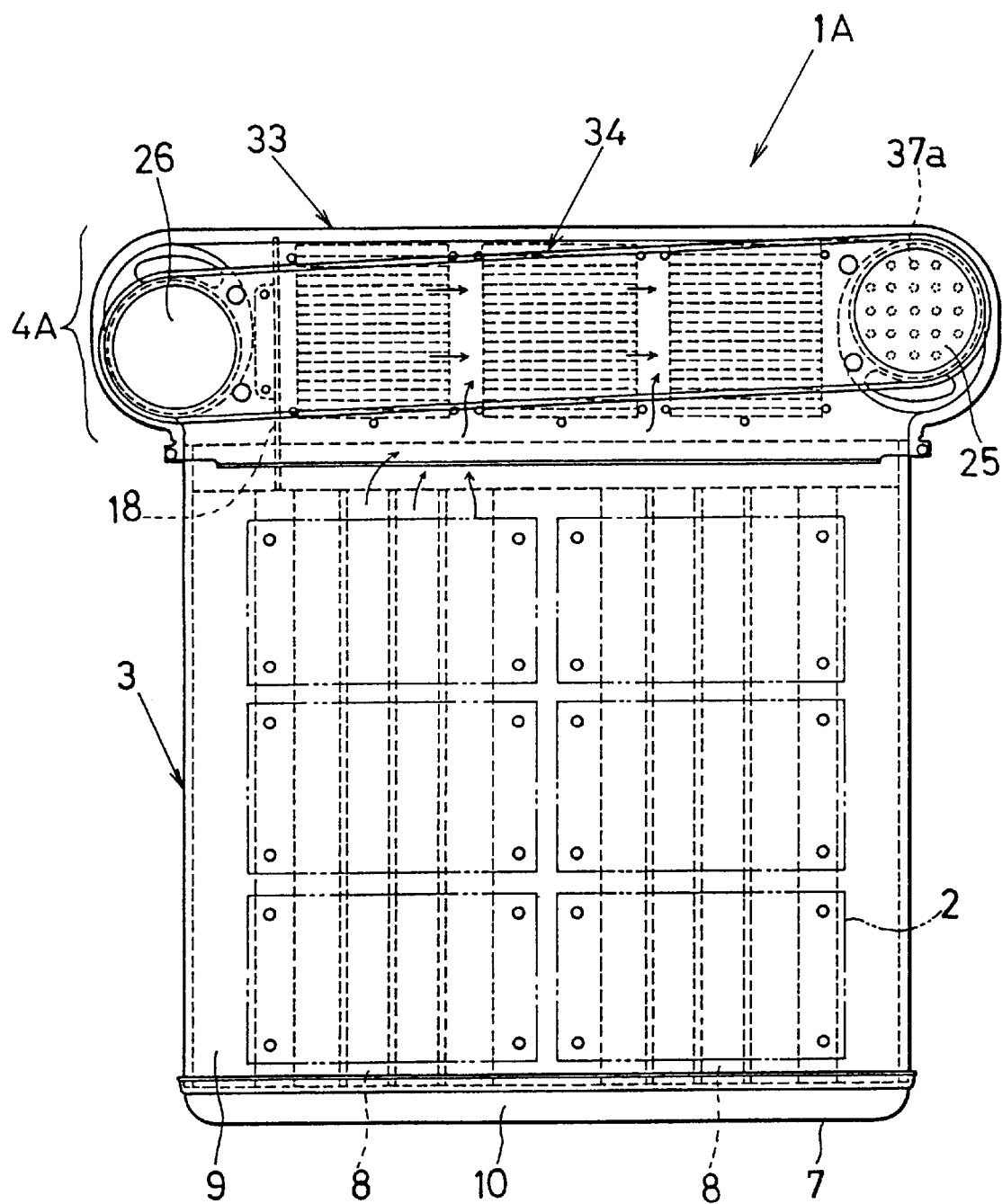
FIG. 12 is a front view of a cooling device according to a sixth preferred embodiment of the present invention.
Figure 13:
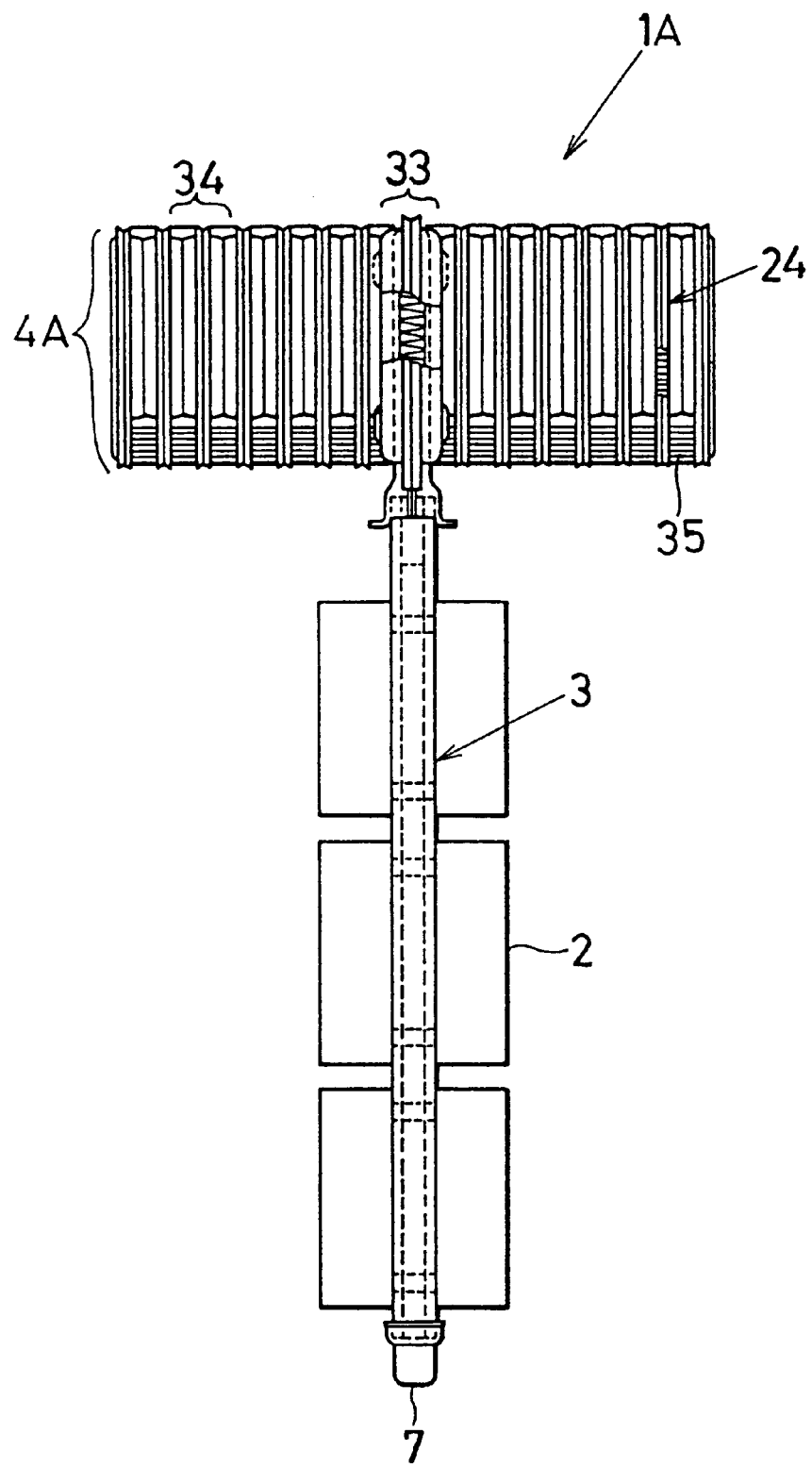
FIG. 13 is a side view of the cooling device according to the sixth embodiment.

In the above-described embodiments, outside air horizontally passes through the radiator 4. In the sixth embodiment, as shown in FIGS. 12, 13, outside air vertically passes through a radiator 4A. As shown in FIG. 13, the radiator 4A includes a connection pipe 33 disposed at an upper side of the refrigerant tank 3, a plurality of heat radiating tubes 34 laminated in a horizontal direction at both sides of the connection pipe 33, and a plurality of heat radiating fins 35 each of which is disposed between the connection pipe 33 and the heat radiating tube 34 adjacent to the connection pipe 33, and between adjacent the heat radiating tubes 34. The refrigerant tank 3 is similar to that in the first embodiment, and the explanation thereof is omitted.

In the sixth embodiment, as shown in FIGS. 14A, 14B, two restriction plates 37 are respectively provided in two tube plates 36 for forming the connection tube 33, and a plurality of small holes 37a are opened in each of the restriction plates 37. Thus, the effect similar to the first embodiment can be obtained in the sixth embodiment. Further, a plurality of the slit-like openings and the louvers described in the second embodiment may be provided instead of the small holes 37a.

Although the present invention has been fully described in connection with preferred embodiments thereof with reference to the accompanying drawings, it is to be noted that various changes and modifications will become apparent to those skilled in the art.

For example, in each of the above-described embodiments, a refrigerant member for preventing liquid refrigerant from flowing into the refrigerant-condensing passage 24 is formed into a plate like. However, the restriction member may be formed into the other shape. That is, the restriction member may be formed by a plurality of louvers, and may be formed by porous member.

Such changes and modifications are to be understood as being within the scope of the present invention as defined by the appended claims.

What is claimed is:

1. A cooling device boiling and condensing refrigerant, for cooling a heat-generating member, said cooling device comprising:

a refrigerant tank having a refrigerant chamber for containing liquid refrigerant which is partially boiled and vaporized into gas refrigerant by absorbing heat from the heat-generating member attached to an outer surface of said refrigerant tank;

a radiator having an inlet passage into which gas refrigerant from said refrigerant tank flows, and a refrigerant-condensing passage in which gas refrigerant from said inlet passage is condensed and liquefied by performing heat-exchange with an outside fluid passing through said radiator; and a restriction member disposed between said refrigerant chamber of said refrigerant tank and said refrigerant-condensing passage of said radiator to prevent liquid refrigerant rising together with gas refrigerant from said refrigerant chamber from flowing into said refrigerant-condensing passage, wherein said restriction member has a plurality of openings for passing through gas refrigerant, each of said openings having a predetermined opening area smaller than a passage sectional area of said inlet passage, said restriction member is a restriction plate having the plurality of openings;

said radiator includes a plurality of tubes each of which is formed by connecting two tube plates into a hollow shape;

said tubes are for forming said refrigerant-condensing passage and said inlet passage; and said restriction plate is one of said tube plates.

2. The cooling device according to claim 1, wherein said restriction member is disposed between said refrigerant chamber and said inlet passage.

3. The cooling device according to claim 1, wherein said radiator includes a connection pipe having a lower tank portion connected to said refrigerant tank, and an upper plate connected to said lower tank portion; and a partition plate for partitioning an interior of said connection pipe into a first communication passage through which refrigerant from said refrigerant chamber flows into said inlet passage, and a second communication passage through which liquid refrigerant condensed in said refrigerant-condensing passage returns to said refrigerant chamber.

4. A cooling device boiling and condensing refrigerant, for cooling a heat-generating member, said cooling device comprising:

a refrigerant tank having a refrigerant chamber for containing liquid refrigerant which is partially boiled and vaporized into gas refrigerant by absorbing heat from the heat-generating member attached to an outer surface of said refrigerant tank;

a radiator having an inlet passage into which gas refrigerant from said refrigerant tank flows, and a refrigerant-condensing passage in which gas refrigerant from said inlet passage is condensed and liquefied by performing heat-exchange with an outside fluid passing through said radiator; and a restriction member disposed between said refrigerant chamber of said refrigerant tank and said refrigerant-condensing passage of said radiator to prevent liquid refrigerant rising together with gas refrigerant from said refrigerant chamber from flowing into said refrigerant-condensing passage; wherein said radiator includes a connection pipe having a lower tank portion connected to said refrigerant tank, and an upper plate connected to said lower tank portion; and a partition plate for partitioning an interior of said connection pipe into a first communication passage through which refrigerant from said refrigerant chamber flows into said inlet passage, and a second communication passage through which liquid refrigerant condensed in said refrigerant-condensing passage returns to said refrigerant chamber;

said restriction member has a plurality of openings for passing through gas refrigerant, each of said openings having a predetermined opening area smaller than a passage sectional area of said inlet passage, and said restriction member is said upper plate of said connection pipe.

5. A cooling device boiling and condensing refrigerant, for cooling a heat-generating member, said cooling device comprising:

a refrigerant tank having a refrigerant chamber for containing liquid refrigerant which is partially boiled and vaporized into gas refrigerant by absorbing heat from the heat-generating member attached to an outer surface of said refrigerant tank;

a radiator having an inlet passage into which gas refrigerant from said refrigerant tank flows, and a refrigerant-condensing passage in which gas refrigerant from said inlet passage is condensed and liquefied by performing heat-exchange with an outside fluid passing through said radiator; and restriction means disposed between said refrigerant chamber of said refrigerant tank and said refrigerant-condensing passage of said radiator to prevent liquid refrigerant rising together with gas refrigerant from said refrigerant chamber from flowing into said refrigerant-condensing passage, wherein said restriction means has a plurality of openings for passing through gas refrigerant, each of said openings having a predetermined opening area smaller than a passage sectional area of said inlet passage, and said restriction means includes a first restriction plate having the plurality of openings;

said radiator includes a plurality of tubes each of which is formed by connecting two tube plates into a hollow shape;

said tubes are for forming said refrigerant-condensing passage and said inlet passage; and said first restriction plate is one of said tube plates.

6. The cooling device according to claim 5, wherein:

said restriction means includes a second restriction plate having a plurality of openings; and said second restriction plate is disposed to have a predetermined distance from said first restriction plate.

7. The cooling device according to claim 5, wherein:

said restriction means includes a second restriction plate disposed approximately in parallel with said restriction plate, said second restriction plate having a plurality of holes;

said second restriction plate is disposed to have a predetermined distance from said first restriction plate; and said holes are positioned in each of said restriction plates to be shifted from each other.

8. The cooling device according to claim 5, wherein:

said restriction means includes a plurality of louvers formed in said tube plates.

* * * * *